(12) United States Patent
Ellis-Monaghan et al.

(10) Patent No.: US 11,282,883 B2
(45) Date of Patent: Mar. 22, 2022

(54) TRENCH-BASED PHOTODIODES

(71) Applicant: GLOBALFOUNDRIES U.S. Inc., Santa Clara, CA (US)

(72) Inventors: John J. Ellis-Monaghan, Grand Isle, VT (US); Steven M. Shank, Jericho, VT (US); Vibhor Jain, Essex Junction, VT (US); Anthony K. Stamper, Williston, VT (US); John J. Pekarik, Underhill, VT (US)

(73) Assignee: GlobalFoundries U.S. Inc., Santa Clara, CA (US)

( * ) Notice: Subject to any disclaimer, the term of this patent is extended or adjusted under 35 U.S.C. 154(b) by 103 days.

(21) Appl. No.: 16/713,423

(22) Filed: Dec. 13, 2019

(65) Prior Publication Data

US 2021/0183918 A1    Jun. 17, 2021

(51) Int. Cl.
*H01L 31/113* (2006.01)
*H01L 27/146* (2006.01)

(52) U.S. Cl.
CPC .... *H01L 27/1463* (2013.01); *H01L 27/14643* (2013.01); *H01L 27/14689* (2013.01)

(58) Field of Classification Search
None
See application file for complete search history.

(56) References Cited

U.S. PATENT DOCUMENTS

| | | | |
|---|---|---|---|
| 6,667,528 B2 | 12/2003 | Cohen et al. | |
| 7,777,250 B2 | 8/2010 | Lochtefeld | |
| 7,790,495 B2 | 9/2010 | Assefa et al. | |
| 8,313,967 B1 | 11/2012 | Lee et al. | |
| 8,558,336 B2 | 10/2013 | Su et al. | |
| 9,064,699 B2 | 6/2015 | Wang et al. | |
| 2002/0109147 A1 | 8/2002 | Shirai et al. | |
| 2005/0263805 A1* | 12/2005 | Mouli | H01L 27/14625 257/292 |
| 2006/0289911 A1* | 12/2006 | Lee | H01L 27/1463 257/292 |
| 2007/0026326 A1* | 2/2007 | Kim | H01L 27/14643 430/57.3 |
| 2007/0099315 A1 | 5/2007 | Maa et al. | |
| 2007/0187734 A1* | 8/2007 | Adkisson | H01L 27/1463 257/293 |
| 2008/0070355 A1 | 3/2008 | Lochtefeld et al. | |
| 2009/0072284 A1 | 3/2009 | King et al. | |

OTHER PUBLICATIONS

Anthony K. Stamper et al., "Photodiodes Integrated Into a Bicmos Process" filed Aug. 19, 2019 as U.S. Appl. No. 16/544,074.

* cited by examiner

*Primary Examiner* — Ali Naraghi
(74) *Attorney, Agent, or Firm* — Thompson Hine LLP; Francois Pagette

(57) ABSTRACT

Structures including a photodiode and methods of fabricating such structures. A trench extends from a top surface of a substrate to a depth into the substrate. The photodiode includes an active layer positioned in the trench. Trench isolation regions, which are located in the substrate, are arranged to surround the trench. A portion of the substrate is positioned in a surrounding relationship about the active layer and between the active layer and the trench isolation regions.

18 Claims, 7 Drawing Sheets

TRENCH-BASED PHOTODIODES

BACKGROUND

The present invention relates to photonics chips and, more particularly, to structures including a photodiode and methods of fabricating such structures.

Light Detection and Ranging (LIDAR) is a laser-mapping technology that measures distance to a target by illuminating the target with pulsed laser light and measuring pulses reflected from the target with a sensor. LIDAR is used in, for example, autonomous robots and self-driving cars. The sensor employed in a LIDAR system, and also in other infrared wavelength motion detection systems, is a germanium photodiode. Germanium exhibits high photon absorption in the infrared wavelength range. Typically, a two-chip solution is used in which one chip includes one or more germanium photodiodes and a second chip includes a trans-impedance amplifier as well as associated logic and input/output devices. Each germanium photodiode converts impinging electromagnetic radiation into current as photons are absorbed. The trans-impedance amplifier amplifies the current generated by the photodiode and converts the current into a voltage.

Improved structures including a photodiode and methods of fabricating such structures are needed.

SUMMARY

In an embodiment of the invention, a structure includes a substrate having a top surface and a trench extending from the top surface to a depth into the substrate. The structure further includes a photodiode having a layer positioned in the trench, and a plurality of trench isolation regions in the substrate. The trench isolation regions are arranged to surround the trench, and a portion of the substrate is positioned in a surrounding relationship about the active layer and between the active layer and the trench isolation regions.

In an embodiment of the invention, a structure includes a substrate having a top surface and a trench extending from the top surface of the substrate to a depth into the substrate. The structure further includes a photodiode having a layer positioned in the trench, and a dielectric collar positioned in the trench between the layer and sidewalls of the trench.

In an embodiment of the invention, a method includes forming a trench extending from a top surface of a substrate to a depth in the substrate, forming a layer of a photodiode in the trench, and forming a plurality of trench isolation regions in the substrate. The layer is composed of germanium, a germanium-tin alloy, or a silicon-germanium alloy, and the trench isolation regions are arranged to surround the trench, and a portion of the substrate is positioned in a surrounding relationship about the active layer and between the active layer and the trench isolation regions.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention. In the drawings, like reference numerals refer to like features in the various views.

DETAILED DESCRIPTION

Figure 1:
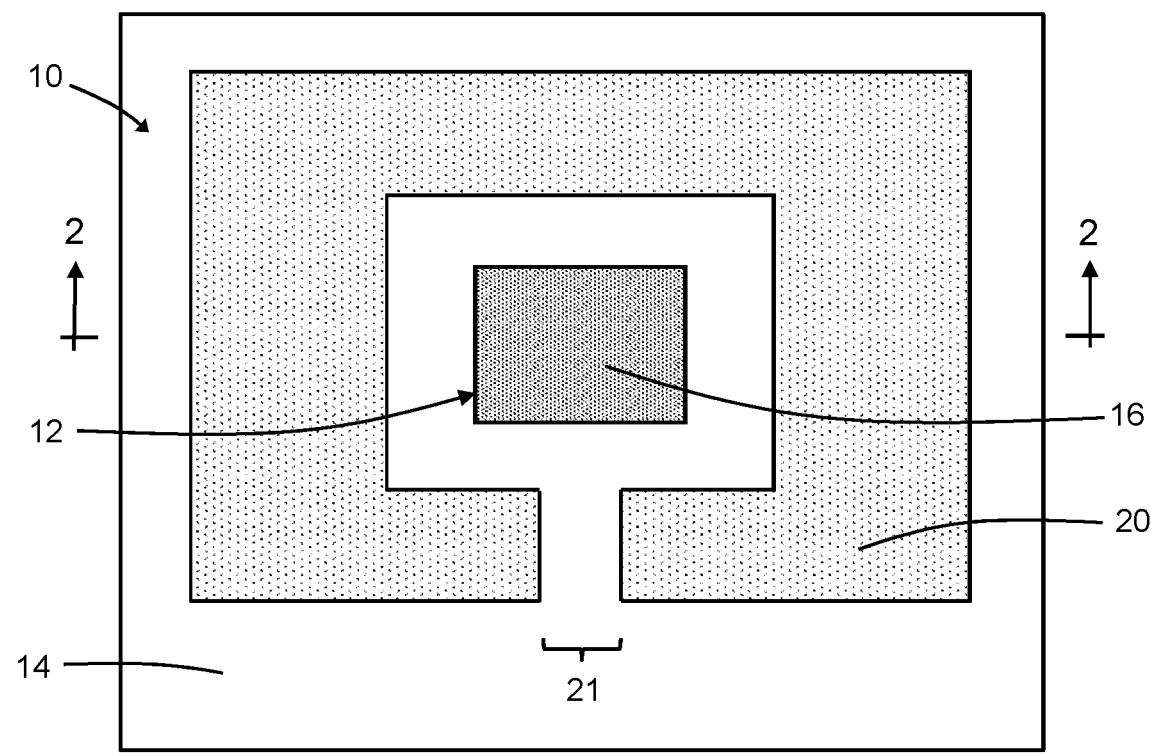
FIG. 1 is a top view of a structure at an initial fabrication stage of a processing method in accordance with embodiments of the invention.
Figure 2:
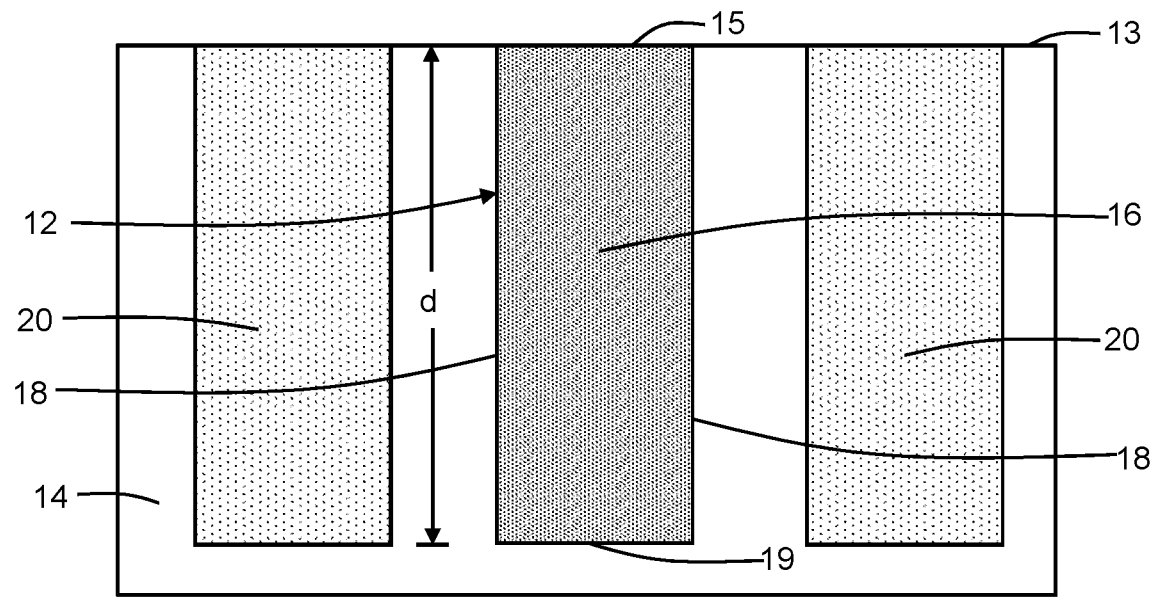
FIG. 2 is a cross-sectional view of the structure taken generally along line 2-2 in FIG. 1.

With reference to FIGS. 1, 2 and in accordance with embodiments of the invention, a structure 10 for a photodiode includes a trench 12 that is formed in a substrate 14 and an active layer 16 that is formed in the trench 12. The substrate 14 may be composed of a monocrystalline or single-crystal semiconductor material, such as single-crystal silicon, and may be lightly doped to have p-type conductivity. The trench 12 is formed by patterning the substrate 14 with lithography and etching processes. The lithography process may include forming an etch mask by applying a layer of an organic photoresist by a spin coating process, pre-baking, exposing the photoresist to electromagnetic radiation projected through a photomask, baking after exposure, and developing with a chemical developer to define an opening over the intended location of the trench 12. One or more etching processes, such as reactive ion etching processes, may be used to form the trench 12 with the etch mask present. The etch mask may be stripped after forming the trench 12.

The trench 12 penetrates from the top surface 13 of the substrate 14 to a given depth into the substrate 14. The trench 12 includes sidewalls 18 that extend into substrate 14 to a portion of the substrate 14 that is exposed at the trench bottom 19. The depth, d, of the trench 12 may be selected according to the wavelength of the electromagnetic radiation to be detected by the active layer 16. In an embodiment, the trench 12 may have a depth relative to the top surface 13 of the substrate 14 that is greater than or equal to three (3) microns.

The active layer 16 may be composed of a single-crystal semiconductor material that is epitaxially grown from the substrate 14. In an embodiment, the active layer 16 may be composed of single-crystal germanium or silicon-germanium. In an embodiment, the active layer 16 may be composed of a single-crystal alloy containing germanium and tin, such as a germanium-tin alloy containing ten (10) atomic percent of tin. The active layer 16 may be in situ doped during epitaxial growth with a concentration of a dopant, such as an n-type dopant (e.g., arsenic or phosphorus) that provides n-type conductivity. The active layer 16 epitaxially grows from the substrate 14 at the sidewalls 18 of the trench 12 and at bottom 19 of the trench 12. The active layer 16 may be etched back and polished with chemical mechanical polishing, after epitaxial growth, to planarize the active layer 16 relative to a top surface 13 of the substrate 14. In an embodiment, the active layer 16 may include a top surface 15 that is coplanar or substantially coplanar with the top surface 13 of the substrate 14. The active layer 16 may be located fully at and below the top surface 13 of the substrate 14.

Trench isolation regions 20 may be formed in the substrate 14. The trench isolation regions 20 may be formed by patterning trenches in the substrate 14 with lithography and etching processes, depositing a dielectric material, such as silicon dioxide, in the trenches, and polishing with chemical mechanical polishing after deposition. The trench isolation regions 20 are arranged to almost fully surround the trench 12 and the active layer 16 inside the trench 12. The trench isolation regions 20 include a break 21 along one of the side edges of the trench 12 and active layer 16, which is defined in a lithographically-formed etch mask as a covered region when the trenches are patterned.

The trench isolation regions 20 are spaced outwardly from the trench 12 such that a portion of the substrate 14 fully surrounds and has a fully surrounding relationship with the active layer 16 in the trench 12. The portion of the substrate 14 is positioned directly between the active layer 16 and the trench isolation regions 20 at all locations about the sidewalls 18 at the perimeter of the trench 12. The break 21 introduces a discontinuity in the trench isolation regions 20 that provides a connection in the substrate 14 between the active layer 16 and the portion of the substrate 14 having the surrounding relationship with the trench 12.

The trench isolation regions 20 define a waveguiding structure extending in a vertical direction from the top surface 13 of the substrate 14 into the substrate 14 and surrounding the active layer 16. In that regard, the trench isolation regions 20 contain a solid dielectric material having a refractive index that is less than the refractive index of the semiconductor materials of the substrate 14 and the active layer 16.

Figure 3:
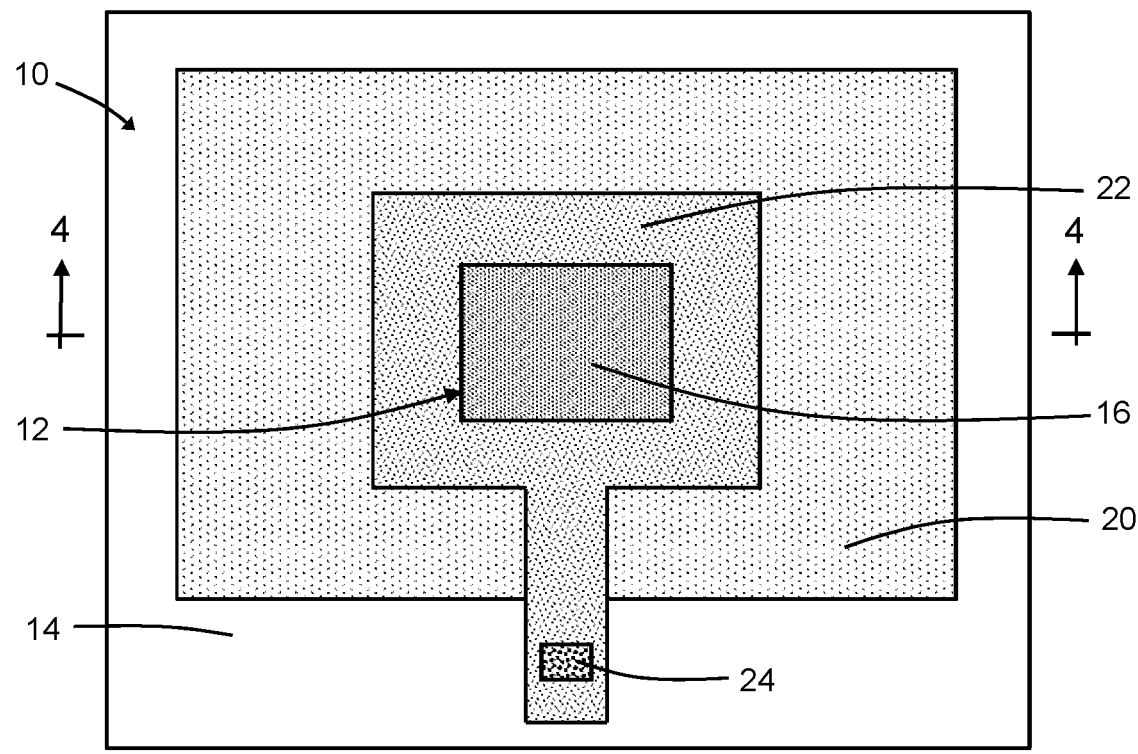
FIG. 3 is a top view of the structure at a fabrication stage of the processing method subsequent to FIG. 1.
Figure 4:
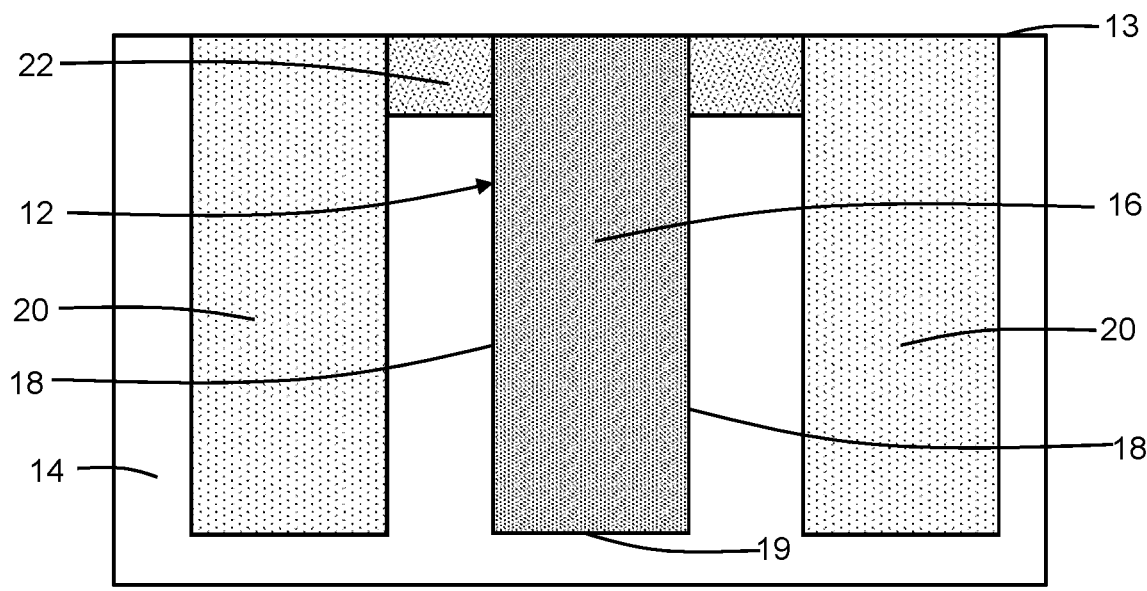
FIG. 4 is a cross-sectional view of the structure taken generally along line 4-4 in FIG. 3.

With reference to FIGS. 3, 4 in which like reference numerals refer to like features in FIGS. 1, 2 and at a subsequent fabrication stage, a doped region 22 is formed in the substrate 14. The doped region 22 is positioned beneath the top surface 13 of the substrate 14 and extends to a shallower depth into the substrate than the trench 12 and active layer 16. The doped region 22 has the same conductivity type as the active layer 16 and an opposite conductivity type from the substrate 14. In an embodiment, the semiconductor material of the doped region 22 may be doped with an n-type dopant (e.g., phosphorus and/or arsenic) that provides n-type conductivity. The doped region 22 may be formed by, for example, ion implantation with an implantation mask exposing the section of the substrate 14 surrounding the active layer 16 in the trench 12 and a strip that extends through the break 21 in the trench isolation regions 20 to a location outside of the trench isolation regions 20. The implantation mask may include a layer of a light-sensitive material, such as a photoresist, applied by a spin-coating process, pre-baked, exposed to light projected through a photomask, baked after exposure, and developed with a chemical developer. The implantation conditions (e.g., ion species, dose, kinetic energy) may be selected to tune the electrical and physical characteristics (e.g., electrical resistivity and depth profile) of the doped region 22. The implantation mask may be stripped after forming the doped region 22.

A contact region 24 is formed in the doped region 22. The contact region 24 has the same conductivity type as the doped region 22 and may be more heavily doped than the doped region 22. In an embodiment, the semiconductor material of the contact region 24 may be doped with an n-type dopant (e.g., phosphorus and/or arsenic) that provides n-type conductivity. The contact region 24 may be formed by, for example, ion implantation with an implantation mask exposing the intended location for the contact region 24. The implantation mask may include a layer of a light-sensitive material, such as a photoresist, applied by a spin-coating process, pre-baked, exposed to light projected through a photomask, baked after exposure, and developed with a chemical developer. The implantation conditions (e.g., ion species, dose, kinetic energy) may be selected to tune the electrical and physical characteristics (e.g., electrical resistivity and depth profile) of the contact region 24. The implantation mask may be stripped after forming the contact region 24.

Figure 5:
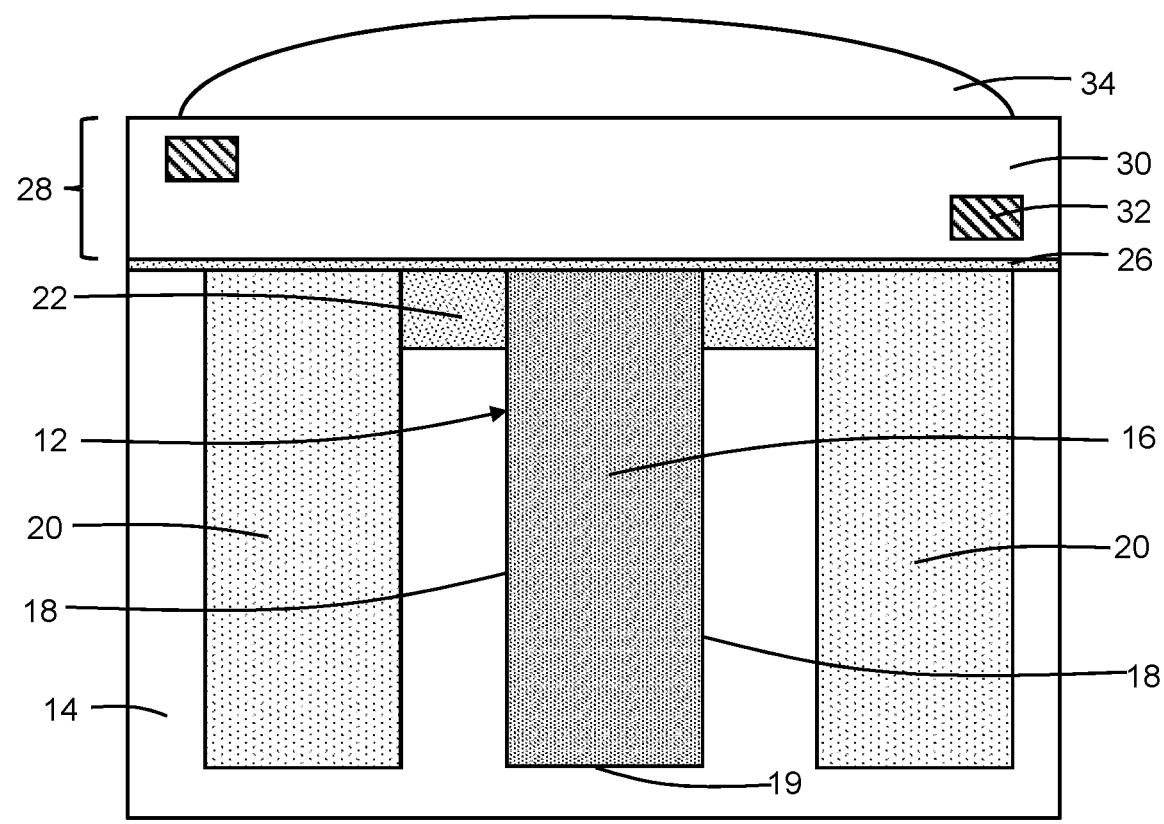
FIG. 5 is a cross-sectional view of the structure at a fabrication stage of the processing method subsequent to FIG. 4.

With reference to FIG. 5 in which like reference numerals refer to like features in FIG. 4 and at a subsequent fabrication stage, a layer 26 is formed over the substrate 14 and, in particular, the layer 26 is formed over the active layer 16 in the trench 12. The layer 26 may be composed of a dielectric material, such as silicon nitride, and the layer 26 may provide an antireflective coating. In an alternative embodiment, the layer 26 may be omitted from the structure 10.

A back-end-of-line (BEOL) stack, generally indicated by reference numeral 28, is formed by back-end-of-line processing over the optional layer 26. The back-end-of-line stack 28 may include one or more interlayer dielectric layers 30 composed of one or more dielectric materials, such as a carbon-doped silicon oxide, and interconnects 32 composed of, for example, copper, tungsten, and/or cobalt that are arranged in the one or more interlayer dielectric layers 30. The active layer 16 is buried beneath the back-end-of-line stack 28 such that the active layer 16 is located in a vertical direction below the top surface of the back-end-of-line stack 28, and the interconnects 32 are positioned so as to not interfere with the operation of the photodiode.

A microlens 34 may be formed over the back-end-of-line stack 28 and above the active layer 16 in the trench 12. The microlens 34 may be composed of a polymer, such as reflowed photoresist, or may be composed of a dielectric material, such as silicon dioxide or silicon nitride. The microlens 34 may circumscribe the active layer 16 and trench isolation regions 20 to promote the functioning of the trench isolation regions 20 as a waveguiding structure.

Figure 6:
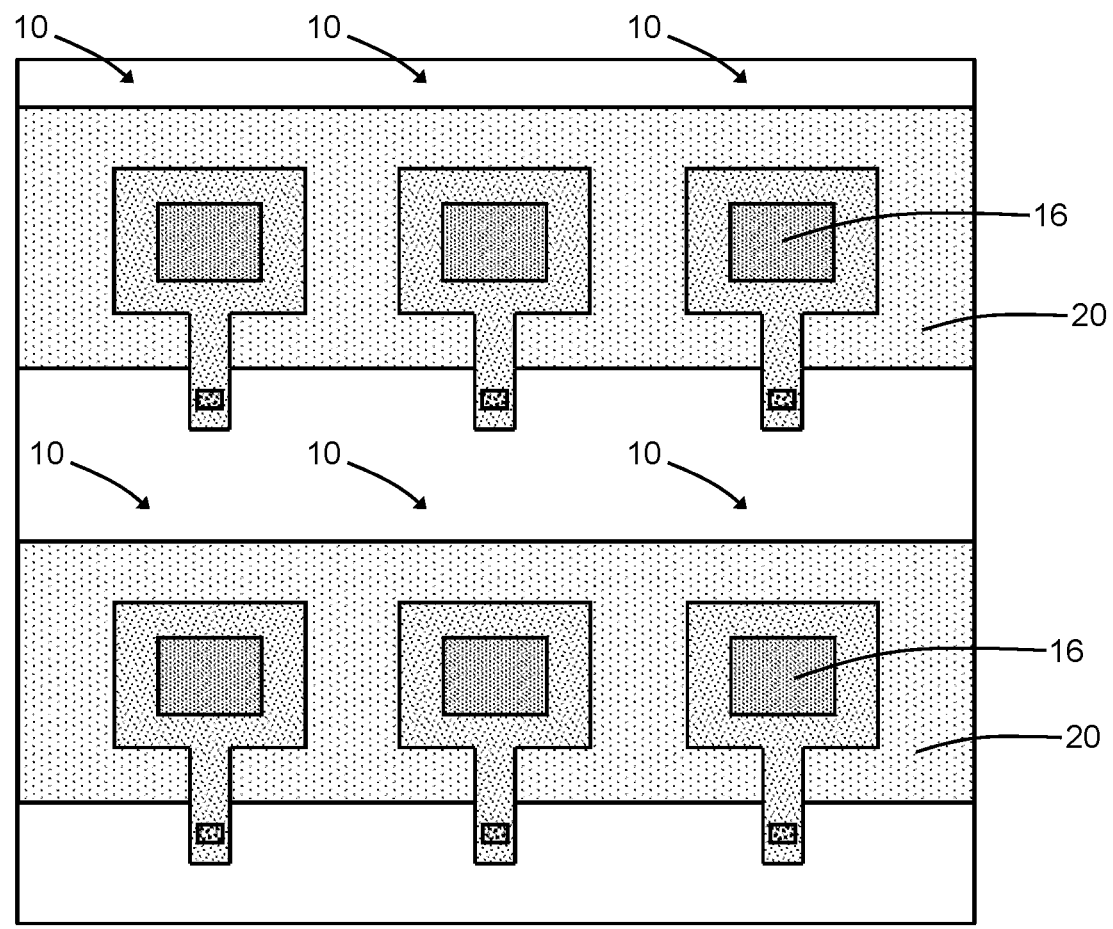
FIG. 6 is a top view of a structure in accordance with embodiments of the invention.

With reference to FIG. 6 in which like reference numerals refer to like features in FIG. 3 and in accordance with alternative embodiments, the structure 10 may be replicated to form an array of pixels in which each individual structure 10 represents a pixel. Each of the structures 10 includes a trench that is similar or identical to trench 12 in the substrate 14 and an active layer that is similar or identical to the active layer 16. The trench isolation regions 20 are shared between the different structures 10, and each active layer 16 is surrounded by the dielectric material of the trench isolation regions 20. The trenches 12 holding the active layers 16 are separated from each other by at least one of the trench isolation regions 20. After forming the layer 26 and back-end-of-line stack 28, an array of microlenses 34 may be formed that are spatially correlated in position with the array of active layers 16. The output from the photodiode of each pixel in the array may be individually measurable.

Figure 7:
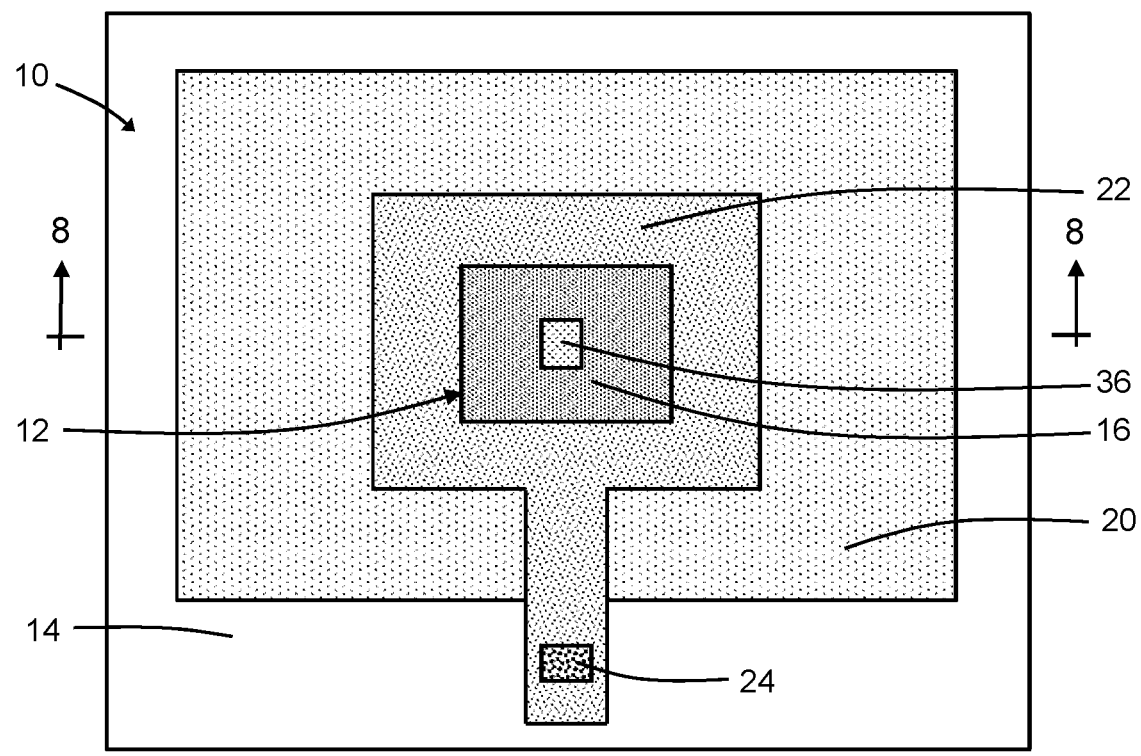
FIG. 7 is a top view of a structure in accordance with alternative embodiments of the invention.
Figure 8:
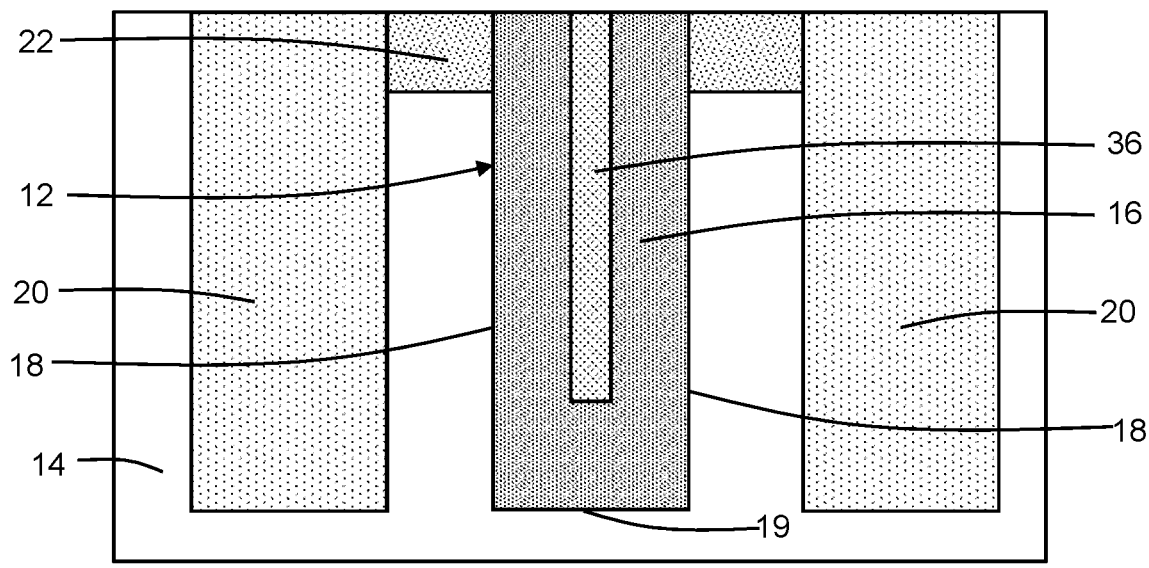
FIG. 8 is a cross-sectional view of the structure taken generally along line 8-8 in FIG. 7.

With reference to FIGS. 7, 8 in which like reference numerals refer to like features in FIGS. 3, 4 and in accordance with alternative embodiments, the active layer 16 may only partially fill the trench 12 following epitaxial growth from the substrate 14 at the sidewalls 18 and bottom 19 of the trench 12. For example, the active layer 16 may include an open central region that is unfilled following epitaxial growth. In an embodiment, the open central region of the active layer 16 may be filled by a layer 36. The active layer 16 is positioned between the layer 36 and the portion of the substrate 14 between the active layer 16 and the sidewalls 18 of the trench 12. The layer 36, which provides a core, is deposited after the epitaxial growth of the active layer 16 and may be planarized along with the active layer 16. In an embodiment, the layer 36 may be composed of a dielectric material, such as silicon dioxide. In an alternative embodiment, the layer 36 may be composed of polysilicon, which may be doped either n-type or p-type. The layer 36 is surrounded by portions of the active layer 16 in the completed structure 10. Processing continues as described in connection with FIG. 5.

Figure 9:
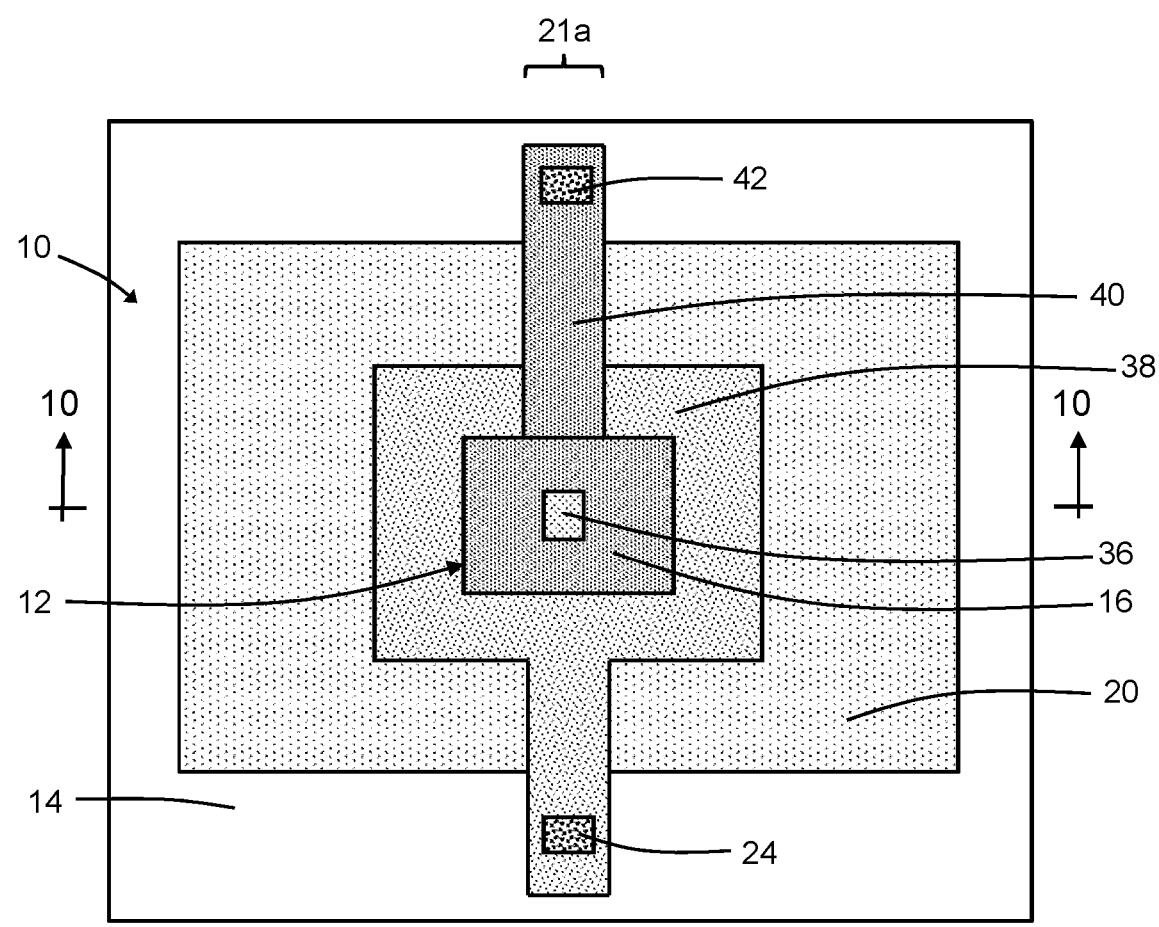
FIG. 9 is a top view of a structure in accordance with alternative embodiments of the invention.
Figure 10:
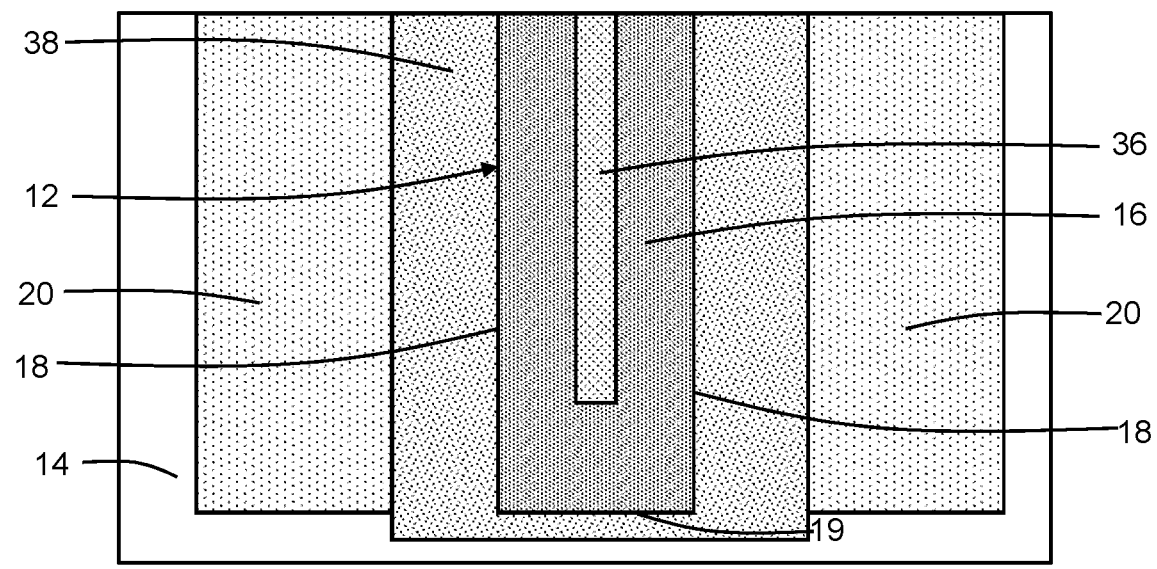
FIG. 10 is a cross-sectional view of the structure taken generally along line 10-10 in FIG. 9.

With reference to FIGS. 9, 10 in which like reference numerals refer to like features in FIGS. 7, 8 and in accordance with alternative embodiments, a doped region 38 may be formed, before the active layer 16 is epitaxially grown, that surrounds the sidewalls 18 and bottom 19 of the trench 12. The doped region 38 is arranged between the sidewalls 18 of the trench 12 and the trench isolation regions 20 and between the bottom 19 of the trench 12 and an underlying portion of the substrate 14. In the representative embodiment, the doped region 38 is formed in the entirety of the portion of the substrate 14 between the sidewalls 18 of the trench 12 and the trench isolation regions 20. In an alternative embodiment, the doped region 38 may be formed in less than the entirety of the portion of the substrate 14 between the sidewalls 18 of the trench 12 and the trench isolation regions 20, and the doped region 38 may be located only proximate to the sidewalls 18 of the trench 12.

The doped region 38 may be composed of single-crystal semiconductor material of the substrate 14 into which a dopant is introduced. The doped region 38 has an opposite conductivity type from the active layer 16. In an embodiment, the semiconductor material of the doped region 38 may be doped with an n-type dopant (e.g., phosphorus and/or arsenic) that provides n-type conductivity, and the semiconductor material of the active layer 16 may be doped with a p-type dopant (e.g., boron) that provides p-type conductivity. In an embodiment, the dopant may be introduced into the portion of the substrate 14 surrounding the sidewalls 18 and bottom 19 of the trench 12 by a masked ion implantation.

The doped region 38 is arranged between the active layer 16 and the trench isolation regions 20 about the entire perimeter of the active layer 16. The doped region 38 is also arranged below the bottom 19 of the trench 12 between the active layer 16 and the underlying portion of the substrate 14. The doped region 38 therefore fully surrounds the active layer 16.

The trench isolation regions 20 include another break 21a, in addition to break 21 (FIG. 1), along one of the side edges of the trench 12 that provides another connection in the substrate 14 to the portion of the substrate 14 that surrounds the trench 12. The added break 21a in the trench isolation regions 20 may located at a side edge that is opposite from the side edge including the break 21 through which the portion of the doped region 22 extends. A doped region 40 is formed in the substrate 14 and extends as a strip from the active layer 16 through the added break 21a in the trench isolation regions 20 to a portion of the substrate 14 outside of the trench isolation regions 20. The doped region 40 extends to a shallower depth into the substrate than the trench 12 and active layer 16. The doped region 40 has the same conductivity type as the active layer 16 and an opposite conductivity type from the doped region 22. In an embodiment, the semiconductor material of the doped region 40 may be doped by masked ion implantation with a p-type dopant (e.g., boron) that provides p-type conductivity. A contact region 42 is formed by masked ion implantation in the substrate 14 and is coupled to the doped region 40. The contact region 42 has the same conductivity type as the doped region 40 and may be more heavily doped than the doped region 40.

Figure 11:
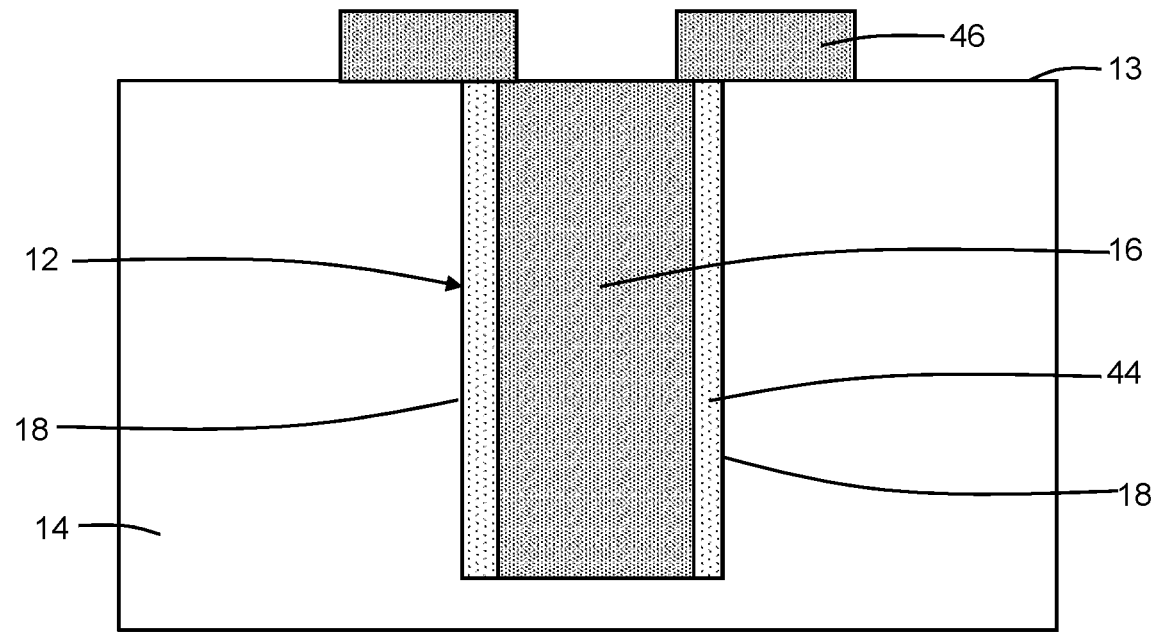
FIG. 11 is a cross-sectional view of a structure in accordance with alternative embodiments of the invention.

With reference to FIG. 11 in which like reference numerals refer to like features in FIG. 4 and in accordance with alternative embodiments, a collar 44 composed of a dielectric material, such as silicon nitride, may be formed inside the trench 12 before forming the active layer 16 inside the trench 12. In particular, the collar 44 may be formed on all of the sidewalls 18 of the trench 12 by depositing a conformal layer of the dielectric material and etching the conformal layer with an anisotropic etching process, such as reactive ion etching. In an embodiment, the active layer 16 may be deposited as non-crystalline (e.g., amorphous) material, followed by recrystallization with an annealing process to transform the non-crystalline material to single-crystal material. The active layer 16 may be positioned in direct contact with the collar 44, and trench isolation regions 20 may be absent from the structure 10.

Straps 46 are formed on the top surface 13 of the substrate 14 and may be composed of polysilicon that is doped to have the same conductivity type as the active layer 16. The straps 46 are coupled to the active layer 16. In an alternative embodiment, the substrate 14 may be thinned from the backside toward the trench bottom 19 and the microlens 34 may be placed over the trench bottom 19 such that the photodiode is illuminated from the backside of the substrate.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate +/−10% of the stated value(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
   a substrate including a top surface and a first trench extending from the top surface to a depth into the substrate;
   a first photodiode including a first active layer positioned in the first trench;
   a doped region located in a first portion of the substrate; and
   a plurality of trench isolation regions arranged in the substrate about the first trench, the trench isolation regions including a break defining a discontinuity in the trench isolation regions,
   wherein the first active layer is doped to have a first conductivity type, the doped region has the first conductivity type of the first active layer, the substrate includes the first portion positioned in a surrounding relationship about the first active layer and between the first active layer and the trench isolation regions, the substrate includes a second portion that extends laterally from the first portion of the substrate through the break in the trench isolation regions to the doped region, and the second portion of the substrate is doped to have the first conductivity type of the first active layer and the doped region.

2. The structure of claim 1 wherein the first active layer has a top surface that is substantially coplanar with the top surface of the substrate.

3. The structure of claim 1 wherein the first active layer has a top surface that is coplanar with the top surface of the substrate.

4. The structure of claim 1 wherein the substrate comprises a semiconductor material, and the trench isolation regions comprise a solid dielectric material having a lower refractive index than the semiconductor material of the substrate.

5. The structure of claim 1 wherein the first photodiode further includes a core layer, and the first active layer is positioned between the core layer and the first portion of the substrate.

6. The structure of claim 5 wherein the core layer comprises silicon dioxide.

7. The structure of claim 5 wherein the core layer comprises polysilicon.

8. The structure of claim 1 wherein the substrate includes a second trench separated from the first trench by one of the trench isolation regions, and further comprising:
   a second photodiode including a second active layer positioned in the second trench.

9. The structure of claim 1 wherein the first active layer is comprised of comprises germanium, and the trench isolation regions comprise silicon dioxide.

10. The structure of claim 1 wherein the first active layer comprises a silicon-germanium alloy, and the trench isolation regions comprise silicon dioxide.

11. A structure comprising:
    a substrate including a top surface and a first trench extending from the top surface to a depth into the substrate, the first trench including sidewalls and a bottom;
    a photodiode including a first active layer positioned in the first trench, the first active layer doped to have a first conductivity type;
    a first doped region positioned in a first portion of the substrate to fully surround the sidewalls and the bottom of the first trench, the first doped region having a second conductivity type opposite from the first conductivity type;
    a plurality of trench isolation regions arranged in the substrate about the first trench, the trench isolation regions including a first break defining a discontinuity in the trench isolation regions,
    wherein the substrate includes a second portion that extends laterally from the first doped region through the first break in the trench isolation regions, and the second portion of the substrate is doped to have the second conductivity type.

12. The structure of claim 11 wherein the trench isolation regions include a second break, and the substrate includes a third portion that extends laterally from the first active layer through the second break in the trench isolation regions.

13. The structure of claim 12 further comprising:
    a second doped region located in the first portion and the third portion of the substrate, the second doped region having the first conductivity type, and the second doped region coupled to the first active layer.

14. The structure of claim 11 wherein the first active layer comprises a germanium-tin alloy, and the trench isolation regions comprise silicon dioxide.

15. The structure of claim 11 wherein the first active layer comprises a silicon-germanium alloy, and the trench isolation regions comprise silicon dioxide.

16. The structure of claim 11 wherein the first active layer comprises a germanium-tin alloy, and the trench isolation regions comprise silicon dioxide.

17. A method comprising:
    forming a trench extending from a top surface of a substrate to a given depth in the substrate;
    forming an active layer of a photodiode in the trench; and
    forming a plurality of trench isolation regions in the substrate,
    wherein the active layer is comprised of germanium, a germanium-tin alloy, or a silicon-germanium alloy, the trench isolation regions are arranged about the trench, the trench isolation regions include a break defining a discontinuity in the trench isolation regions, a first portion of the substrate is positioned in a surrounding relationship about the active layer and between the active layer and the trench isolation regions, the active layer is doped to have a conductivity type, the substrate includes a second portion that extends laterally from the first portion of the substrate through the break in the trench isolation regions, a doped region is located in part in the first portion of the substrate and in part in the second portion of the substrate, and the doped region has the conductivity type of the active layer.

18. The structure of claim 1 wherein the first active layer comprises a germanium-tin alloy, and the trench isolation regions comprise silicon dioxide.

\* \* \* \* \*